United States Patent [19]

Pohl

[11] 4,052,664

[45] Oct. 4, 1977

[54] CIRCUIT MONITOR TO DETERMINE POWER ON AND CIRCUIT WORKING

[76] Inventor: Leonard Buster Pohl, P.O. Box 1661, Soldotna, Alaska 99669

[21] Appl. No.: 686,060

[22] Filed: May 13, 1976

[51] Int. Cl.² .................... G01R 31/02; G01R 19/16
[52] U.S. Cl. ..................................... 324/51; 324/133; 340/253 C
[58] Field of Search ................ 324/51, 119, 122, 126, 324/127, 133; 340/255, 253 A, 253 B, 253 C, 256, 252 R

[56] References Cited

U.S. PATENT DOCUMENTS

| | | | |
|---|---|---|---|
| 2,895,104 | 7/1959 | Hansen et al. | 340/255 X |
| 2,946,955 | 7/1960 | Kuhrt | 324/119 X |
| 2,994,039 | 7/1961 | Parke | 324/127 X |
| 3,258,693 | 6/1966 | Meyer | 324/133 X |
| 3,277,364 | 10/1966 | Abrahamson | 324/133 X |
| 3,555,360 | 1/1971 | Lee | 324/127 X |
| 3,588,688 | 6/1971 | Lockie | 324/51 |
| 3,656,136 | 4/1972 | Blair | 324/51 X |
| 3,784,903 | 1/1974 | Thomas | 324/133 X |
| 3,831,089 | 8/1974 | Pearce | 324/133 X |

Primary Examiner—Gerard R. Strecker
Attorney, Agent, or Firm—Daniel A. Gerety

[57] ABSTRACT

An assembly of components for monitoring an electrical circuit, and which truly indicates whether the circuit is working; the assembly including a voltage transformer in series with a minimum resistance load, a secondary winding of the transformer communicating with a full wave bridge rectifier connected through a gate, cathode, silicon controlled rectifier and silicon rectifier diode to a pilot lamp.

4 Claims, 1 Drawing Figure

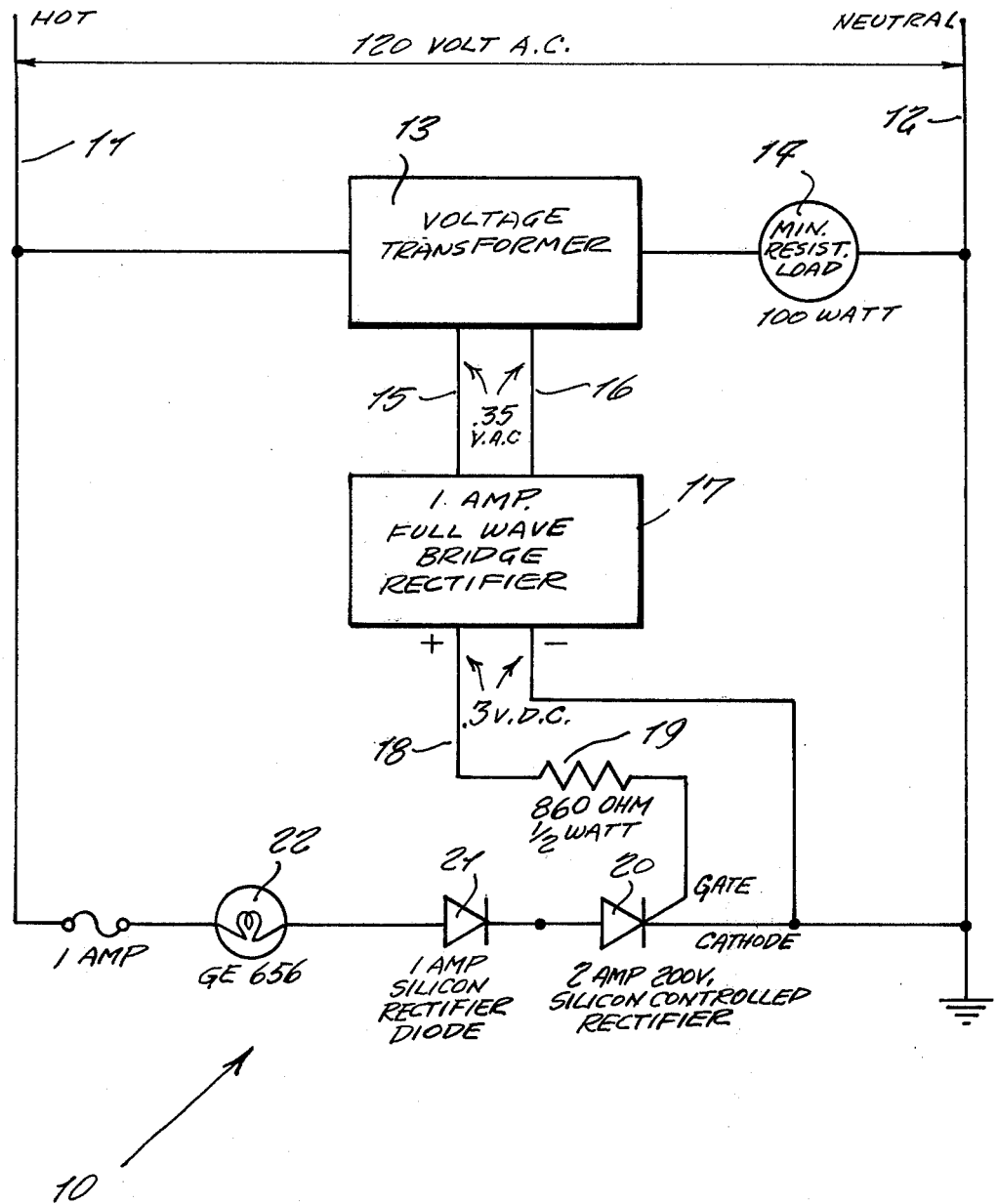

CIRCUIT MONITOR TO DETERMINE POWER ON AND CIRCUIT WORKING

This invention relates generally to monitoring devices. More specifically it relates to a circuit monitor.

It is generally well known, to those skilled in the art of electric circuitry, that when a pilot light is used, the pilot light only indicates whether there is power to the circuit monitored. But it does not tell whether the monitored circuit is working, i.e., whether current is flowing through the monitored circuit. This situation is, of course, objectionable and is, therefore, in want of an improvement.

Accordingly, it is a principal object of the present invention to provide a circuit monitor, which not only indicates whether the power is on to a circuit being monitored, but it also indicates whether the circuit is working, i.e., whether current is flowing through the circuit.

Another object of the present invention is to provide a circuit monitor, which may be of solid state, so as to have no moving parts to wear out.

Yet another object is to provide a circuit monitor, which may be made very compact.

Still another object is to provide a circuit monitor, which may be built for uses in many applications, and which, accordingly, may be made in different sizes.

Other objects are to provide a circuit monitor, which is simple in design, inexpensive to manufacture, rugged in construction, easy to use and efficient in operation.

These and other objects will be readily evident upon a study of the following specification and accompanying drawing, wherein:

The sole FIGURE comprises an electrical circuit of the present invention.

Reference is now made to the drawing in greater detail, wherein the reference numeral 10 represents a circuit monitor according to the present invention. The circuit 10 includes a hot line 11 of 120 volts alternating current, and a neutral line 12. A primary side of a voltage transformer 13 is in series with a minimum resistance load 14 to be monitored and is hooked up between the hot and neutral lines. The secondary side of the transformer is connected by conductors 15 and 16 to a 1 amp. full wave bridge rectifier 17. A conductor 18 from the bridge rectifier 17 is connected to a resistor 19 leading to a silicon controlled rectifier 20 in series with a silicon rectifier diode 21 and a pilot lamp 22.

In the present invention, as illustrated in the drawing, as long as the circuit is connected to draw at least the minimum current, the pilot light 22 will be on. The loss of a completed circuit would turn the pilot light off. This circuit will work with most types of loads. The maximum load would be determined by the size of the wire used in the load winding of the current to the voltage transformer 13. If the circuit on the load winding fails for any reason, the pilot light goes out.

In most pilot lights used, the pilot light indicates only that power is on the circuit, but it does not tell whether the circuit is working.

In the present circuit monitor, when there is a load of at least 100 watts in the circuit, there is a current flow through the voltage transformer load winding. This produces 0.35 volts alternating current in conductors 15 and 16 leading to the bridge rectifier 17. The bridge rectifier 17 converts this current to direct current; this power from the bridge rectifier 17 is used on the gate of the silicon controlled rectifier 20 to give it a fast conduction angle. When the gate of the silicon controlled rectifier 20 receives the signal, it causes the silicon controlled rectifier 20 to conduct, allowing power to flow to the pilot light 22. There will be 50 volts half wave direct current on the pilot light. The lamp used in the pilot lamp is a GE 656. When used at this low voltage, the lamp light will be increased considerably.

The resistor 19 is used to keep the voltage current on the gate of the silicon controlled rectifier at a safe value, when the load of the minimum resistance load 14 is at a high value.

The silicon rectifier diode 21 is used to keep the negative side of the alternating power from feeding into the silicon controlled rectifier 20, which could be destroyed thereby.

Thus, there is provided a circuit monitor, which has the advantage of not only indicating whether the power is on, but which also indicates that the circuit is working.

While various changes may be made in the detail construction, it is understood that such changes will be within the spirit and scope of the present invention as is defined by the appended claims:

What I now claim is:

1. A circuit monitoring means, comprising an assembly of electrical components in an eletrical circuit including a voltage transformer having a primary, or high, voltage side and a secondary, or low, voltage side, a full wave rectifying means, a resistor, a gate controlled rectifier, a diode and a current sensing means wherein the primary side of said voltage transformer is connected in series with a circuit to be monitored, and the series connection consisting of the primary side of said transformer and the load to be monitored are connected across an alternating voltage source, and the secondary side of said transformer is connected to said full wave rectifying means and the positive output of said full wave rectifying means is connected through said resistor to the gate of said gate controlled rectifier and the negative side of said full wave rectifying means is connected to the neutral side of said alternating voltage source, and the said current sensing means, diode and gate controlled rectifier are connected in series between the primary side of said voltage transformer and the neutral side of said alternating voltage source.

2. The combination of electrical components as set forth in claim No. 1 wherein said gate controlled rectifier is a silicon controlled rectifier.

3. The combination of electrical components as set forth in claim No. 1 wherein said current sensing means provides a visual observation of current present.

4. The combination of electrical components as set forth in claim No. 1 wherein said current sensing means is activated by the application of said alternating voltage source and by the flow of current through said circuit to be monitored.

* * * * *